United States Patent
Feng et al.

(10) Patent No.: US 11,373,576 B2
(45) Date of Patent: Jun. 28, 2022

(54) SHIFT REGISTER AND METHOD OF DRIVING THE SAME, GATE DRIVING CIRCUIT

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Silin Feng, Beijing (CN); Li Sun, Beijing (CN); Ying Wang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 532 days.

(21) Appl. No.: 16/337,135

(22) PCT Filed: Sep. 21, 2018

(86) PCT No.: PCT/CN2018/106986
§ 371 (c)(1),
(2) Date: Mar. 27, 2019

(87) PCT Pub. No.: WO2019/140943
PCT Pub. Date: Jul. 25, 2019

(65) Prior Publication Data
US 2021/0327335 A1    Oct. 21, 2021

(30) Foreign Application Priority Data
Jan. 19, 2018    (CN) .......................... 201810054237.6

(51) Int. Cl.
*G09G 3/20*    (2006.01)
*G11C 19/28*    (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ......... G09G 2310/0286; G09G 3/2092; G11C 19/28
See application file for complete search history.

(56) References Cited

U.S. PATENT DOCUMENTS

| 6,556,646 B1 | 4/2003 | Yeo et al. | |
| 2014/0064438 A1* | 3/2014 | Wu ...................... | G09G 3/3677 377/64 |

(Continued)

FOREIGN PATENT DOCUMENTS

| CN | 102831860 A | 12/2012 |
| CN | 103761938 A | 4/2014 |

(Continued)

OTHER PUBLICATIONS

Office action dated Apr. 28, 2020 for application No. CN201810054237.6 with English translation attached.

(Continued)

*Primary Examiner* — Xuemei Zheng
(74) *Attorney, Agent, or Firm* — Nath, Goldberg & Meyer; Joshua B. Goldberg (57) ABSTRACT

The present application provides a shift register and a method of driving the same, and a gate driving circuit. In the shift register, an input sub-circuit is configured to output an input signal to a pull-up node under control of a first clock signal of a first clock signal terminal, an output sub-circuit is configured to output a second clock signal of a second clock signal terminal to the output terminal under control of a voltage level of the pull-up node, a reset sub-circuit is configured to reset voltage levels of the pull-up node and the output terminal under control of a voltage level of a pull-down node, and a reset control sub-circuit is configured to (Continued)

control the voltage level of the pull-down node such that the voltage levels of the pull-up node and the output terminal are reset to a level signal.

11 Claims, 5 Drawing Sheets

(56) References Cited

U.S. PATENT DOCUMENTS

| | | | | |
|---|---|---|---|---|
| 2016/0372031 A1* | 12/2016 | Li | ........................... | G11C 19/28 |
| 2017/0309240 A1* | 10/2017 | Zhang | .................. | G11C 19/287 |
| 2018/0046048 A1* | 2/2018 | Zhao | ...................... | G11C 19/28 |

FOREIGN PATENT DOCUMENTS

| | | | |
|---|---|---|---|
| CN | 105448269 A | * | 3/2016 |
| CN | 105448269 A | | 3/2016 |
| CN | 106448596 A | | 2/2017 |
| KR | 10-2006-0022510 A | | 3/2006 |
| WO | 2017173818 A1 | | 10/2017 |

OTHER PUBLICATIONS

Extended European Search Report dated Sep. 2, 2021 for application No. EP18857433.9.

* cited by examiner

-PRIOR ART-

SHIFT REGISTER AND METHOD OF DRIVING THE SAME, GATE DRIVING CIRCUIT

CROSS-REFERENCE TO RELATED APPLICATION

This is a National Phase Application filed under 35 U.S.C. 371 as a national stage of PCT/CN2018/106986, filed on Sep. 21, 2018, an application claiming the benefit of Chinese Patent Application No. 201810054237.6, filed to the State Intellectual Property Office of P.R. China on Jan. 19, 2018, the contents of which are incorporated herein by reference in the entirety.

TECHNICAL FIELD

The present application belongs to the field of display technology, and specifically relates to a shift register and a method of driving the same, and a gate driving circuit.

BACKGROUND

The current display market is occupied by flat panel displays, and a typical flat panel display device includes a liquid crystal display (LCD) display device or an organic light emitting diode (OLED) display device.

In flat panel display devices, pixels are driven by a shift register line by line or in an interlacing manner. Each row of pixels are driven by one shift register, and a plurality of such shift registers constitute a gate driving circuit. Each of the shift registers includes a plurality of thin film transistors (TFTs) or a storage capacitor (Cs). Current gate driving circuits mostly use a gate-driver-on-array (GOA) technology, that is, a gate driving circuit composed of thin film transistors integrated on a substrate. Since the GOA technology has the advantages of reducing cost, improving process yield of modules and so on, the use of the GOA technology is increasingly wide.

SUMMARY

According to an aspect of the present disclosure, there is provided a shift register, which includes: an input sub-circuit coupled to an input signal terminal and a first clock signal terminal, and configured to output an input signal provided by the input signal terminal to a pull-up node under control of a first clock signal of the first clock signal terminal; an output sub-circuit coupled to the input sub-circuit, an output terminal, and a second clock signal terminal, and configured to output a second clock signal of the second clock signal terminal to the output terminal under control of a voltage level of the pull-up node; a reset control sub-circuit coupled to a pull-down node, the input signal terminal, the first clock signal terminal, and a level signal terminal, and configured to control a voltage level of the pull-down node according to the input signal and the first clock signal; and a reset sub-circuit coupled to the output terminal, the pull-down node, the pull-up node, and the level signal terminal, and configured to reset the voltage level of the pull-up node and a voltage level of the output terminal under control of the voltage level of the pull-down node.

In an embodiment, the input sub-circuit includes a first transistor and a second transistor. The first transistor has a control electrode and a first electrode both coupled to the input signal terminal, and a second electrode coupled to a first electrode of the second transistor. The second transistor has a control electrode coupled to the first clock signal terminal and a second electrode coupled to the pull-up node.

In an embodiment, the output sub-circuit includes a third transistor and a first capacitor. The third transistor has a control electrode coupled to the pull-up node, a first electrode coupled to the second clock signal terminal, and a second electrode coupled to the output terminal. The first capacitor has a first end coupled to the control electrode of the third transistor and a second end coupled to the second electrode of the third transistor.

In an embodiment, the reset sub-circuit includes: an output reset sub-circuit coupled to the output terminal, the pull-down node, and the level signal terminal, and configured to reset the voltage level of the output terminal to a level signal provided by the level signal terminal, under control of the voltage level of the pull-down node; and a pull-up node reset sub-circuit coupled to the pull-up node, the pull-down node, and the level signal terminal, and configured to reset the voltage level of the pull-up node to the level signal provided by the level signal terminal, under control of the voltage level of the pull-down node.

In an embodiment, the output reset sub-circuit includes a fourth transistor having a control electrode coupled to the pull-down node, a first electrode coupled to the output terminal, and a second electrode coupled to the level signal terminal. The pull-up node reset sub-circuit includes a seventh transistor having a control electrode coupled to the pull-down node, a first electrode coupled to the pull-up node, and a second electrode coupled to the level signal terminal.

In an embodiment, the reset control sub-circuit includes a fifth transistor, a sixth transistor, and a second capacitor. The fifth transistor has a control electrode and a first electrode both coupled to the first clock signal terminal, and a second electrode coupled to the pull-down node. The sixth transistor has a control electrode coupled to the input signal terminal, a first electrode coupled to the second electrode of the fifth transistor, and a second electrode coupled to the level signal terminal. The second capacitor has a first end coupled to the first electrode of the sixth transistor and a second end coupled to the second electrode of the sixth transistor.

In an embodiment, a ratio of a width-to-length ratio of the fifth transistor to a width-to-length ratio of the sixth transistor is 1:5.

According to another aspect of the present disclosure, there is provided a method of driving the above shift register. The shift register includes an input sub-circuit coupled to an output sub-circuit, an input signal terminal and a first clock signal terminal; the output sub-circuit coupled to an output terminal, and a second clock signal terminal; a reset control sub-circuit coupled to a pull-down node, the input signal terminal, the first clock signal terminal, and a level signal terminal; and a reset sub-circuit coupled to the output terminal, the pull-down node, the pull-up node, and the level signal terminal. The method includes: outputting an input signal provided by the input signal terminal to the pull-up node through the input sub-circuit, under control of a first clock signal provided by the first clock signal terminal and the input signal; outputting a second clock signal to the output terminal through the output sub-circuit, under control of a voltage level of the pull-up node; controlling, by the reset control sub-circuit, a voltage level of the pull-down node according to the first clock signal and the input signal; and resetting, by the reset sub-circuit, the voltage level of the pull-up node and a voltage level of the output terminal to a level signal provided by the level signal terminal, under control of the voltage level of the pull-down node.

In an embodiment, the first clock signal and the second clock signal are complementary pulse signals.

In an embodiment, each time period for driving the shift register is divided into an input phase, an output phase, a reset phase, and a holding phase. The method includes: in the input phase, providing the first clock signal of a first level through the first clock signal terminal, and providing the input signal of the first level through the input signal terminal, such that the input sub-circuit outputs the input signal to the pull-up node and the output sub-circuit outputs the second clock signal of a second level different from the first level to the output terminal; in the output phase; providing the first clock signal of the second level through the first clock signal terminal, and providing the input signal of the second level through the input signal terminal, such that the output sub-circuit maintains the voltage level of the pull-up node in the input phase and the output sub-circuit outputs the second clock signal of the first level to the output terminal; in the reset phase, providing the first clock signal of the first level through the first clock signal terminal, providing the input signal of the second level through the input signal terminal, and providing the second clock signal of the second level through the second clock signal terminal, such that the reset control sub-circuit controls the voltage level of the pull-down node to the first level and the reset sub-circuit resets the voltage level of the pull-up node and the voltage level of the output terminal to the level signal; and in the holding phase, maintaining the voltage level of the pull-down node in the reset phase by the reset control sub-circuit, and maintaining the voltage levels of the pull-up node and the output terminal in the reset phase by the reset sub-circuit.

According to still another aspect of the present disclosure, there is provided a gate driving circuit including a plurality of above-described shift registers, in which the plurality of shift registers are cascaded.

In an embodiment, an output terminal of a previous stage of shift register is coupled to an input signal terminal of a current stage of shift register.

DETAILED DESCRIPTION

To make those skilled in the art better understand the technical solutions of the present disclosure, a shift register and a method of driving the same, a gate driving circuit and a method of driving the same, and a display substrate according to the present disclosure will be further described in detail below in conjunction with the accompanying drawings and specific implementations.

Figure 1:
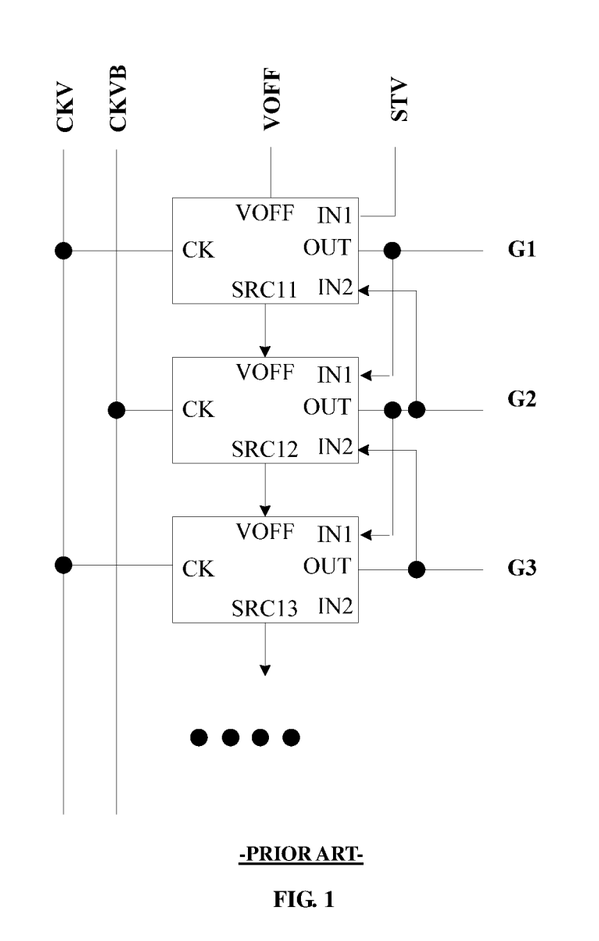
FIG. 1 is a schematic diagram illustrating a conventional gate driving circuit composed of a plurality of cascaded shift registers.

The gate driving circuit must ensure that pixels have a certain charging time, so it is necessary to set some low-level or high-level holding points. In addition, as shown in FIG. 1, a plurality of stages of shift registers are usually cascaded and disposed in the non-display area around the display area. For a certain shift register, the output signal of the previous stage is used as its input signal, and the output signal of the next stage is used as its reset signal, and the stages are closely related to each other. The above reasons lead to an increase in the area and power consumption of the GOA, which hinders the realization of the narrow bezel.

With the development of technology and productivity, the demands for stability, low power consumption and narrow bezel of gate driving circuits are increasing. To meet these demands, changing the circuit structure and reducing the numbers of TFTs and signal lines in the GOA circuit is the most direct path.

Embodiments of the present disclosure provide a shift register, at least for the problem that the reset signal of the shift register in the prior art is usually provided by the previous shift register and thus the area of the GOA is wasted and the power consumption is increased. The shift register according to the embodiments of the present disclosure realizes self-reset by its own circuit structure, so the current stage of shift register does not need the next shift register to provide the reset signal of the current stage. Therefore, the shill register according to the embodiments of the present disclosure has low power consumption and a small number of signal lines, thereby simplifying circuit structure and layout.

Figure 2:
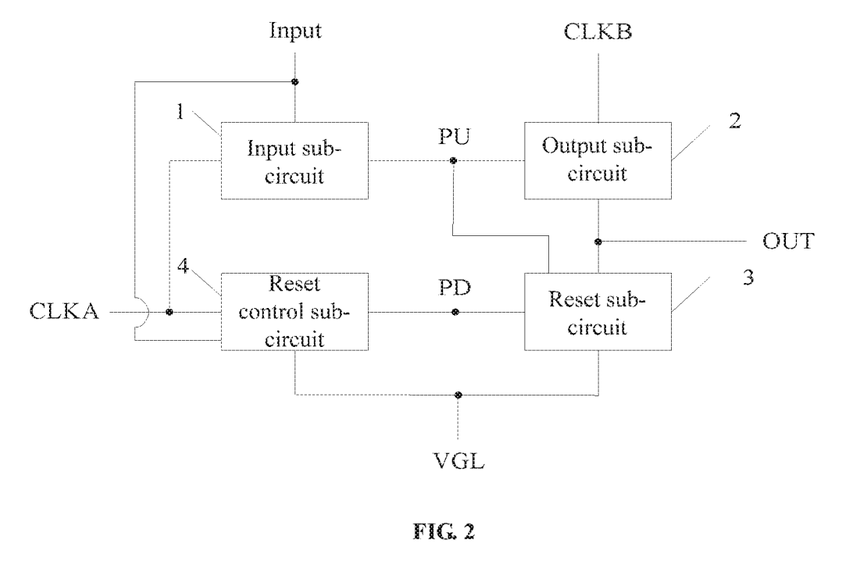
FIG. 2 is a block diagram of a shift register according to an embodiment of the present disclosure.

As shown in FIG. 2, the shift register includes an input sub-circuit output sub-circuit 2, a reset sub-circuit 3, and a reset control sub-circuit 4.

The input sub-circuit 1 is coupled to the output sub-circuit 2, an input signal terminal and a first clock signal terminal, and configured to output an input signal Input to a pull-up node PU under the control of a first clock signal CLKA of the first clock signal terminal.

The output sub-circuit 2 is coupled to an output terminal and a second clock signal terminal, and configured to output a second clock signal CLKB of the second clock signal terminal to the Output terminal under the control of a voltage level of the pull-up node PU.

The reset sub-circuit 3 is coupled to the output terminal, a pull-down node PD, the pull-up node PU, and a level signal terminal, and configured to reset the voltage level of the pull-up node PU and a voltage level of the output terminal OUT under the control of a voltage level of the pull-down node PD.

The reset control sub-circuit 4 is coupled to the pull-down node PD, the input signal terminal, the first clock signal terminal, and the level signal terminal, and configured to control the voltage level of the pull-down node PD according to the input signal Input of the input signal terminal and the first clock signal CLKA of the first clock signal terminal, such that the reset sub-circuit 3 resets the voltage levels of the pull-up node PU and the output terminal OUT to a level signal VGL, which is a signal having a constant voltage level (for example, a signal having a constant low level).

In the shift register, the input sub-circuit 1 and the output sub-circuit 2 are coupled at the pull-up node PU, and the reset control sub-circuit 4 and the reset sub-circuit 3 are coupled at the pull-down node PD.

In the shift register, the input sub-circuit 1 and the reset control sub-circuit 4 both employ the input signal Input as their own input signals, so the current stage of shift register does not need the next shift register to provide the reset signal of the current stage. Therefore, the shift register has a small number of signal lines, thereby simplifying circuit structure and layout.

Figure 3:
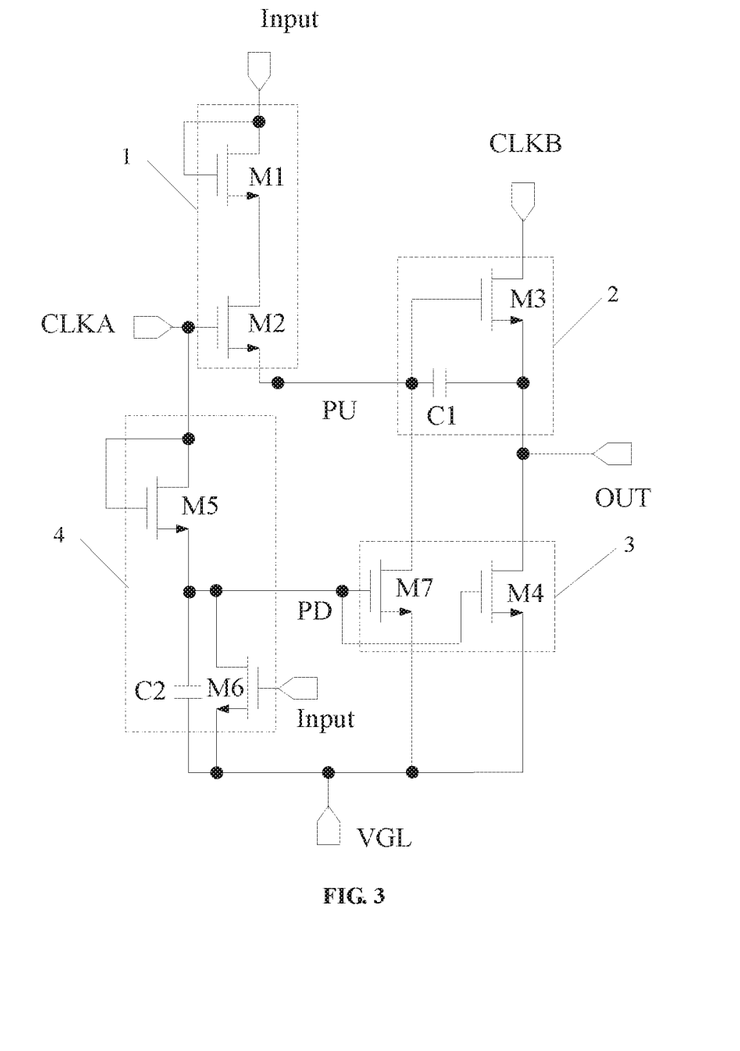
FIG. 3 is a circuit schematic diagram of a shift register according to an embodiment of the present disclosure.

Referring to FIG. 3, structures of the sub-circuits will be described in detail below.

The input sub-circuit 1 introduces the input signal Input to charge the pull-up node PU. The input sub-circuit 1 includes a first transistor M1 and a second transistor M2.

The first transistor M1 has a control electrode and a first electrode both coupled to the input signal terminal (which is configured to receive the input signal Input), and a second electrode coupled to a first electrode of the second transistor M2.

The second transistor M2 has a control electrode coupled to the first clock signal terminal (which is configured to receive the first clock signal CLKA) and a second electrode coupled to the pull-up node PU, i.e., coupled to the output sub-circuit 2.

The output sub-circuit 2 outputs a gate driving signal of the current stage, and includes a third transistor M3 and a first capacitor C1.

The third transistor M3 has a control electrode coupled to the pull-up node, a first electrode coupled to the second clock signal terminal (which is configured to receive the second clock signal CLKB), and a second electrode coupled to the output terminal (which is configured to transfer the output signal OUT).

The first capacitor C1 has a first end coupled to the control electrode of the third transistor M3 and a second end coupled to the second electrode of the third transistor M3.

The reset sub-circuit 3 realizes a reset function and includes a fourth transistor and a seventh transistor M7, The fourth transistor M4 has a control electrode coupled to the pull-down node PD, a first electrode coupled to the output terminal, and a second electrode coupled to the level signal terminal (which is configured to receive the level signal VGL).

The seventh transistor M7 has a control electrode coupled to the pull-down node PD, a first electrode coupled to the pull-up node PU, and a second electrode coupled to the level signal terminal (which is configured to receive the level signal VGL).

The reset control sub-circuit 4 controls a voltage level of the pull-down node PD to the level signal VGL through the input signal Input, which is also an input signal of the input sub-circuit 1, and the first clock signal CLKA, such that the reset sub-circuit 3 realizes reset. After the reset sub-circuit 3 realizes reset, the reset control sub-circuit 4 controls the voltage level of the pull-down node PD to enable the reset sub-circuit 3 holds the voltage level of the pull-up node PU, so as to hold the voltage level of the output terminal. The reset control sub-circuit 4 includes a fifth transistor M5, a sixth transistor M6, and a second capacitor C2.

The fifth transistor M5 has a control electrode and a first electrode both coupled to the first clock signal terminal, and a second electrode coupled to the pull-down node PD.

The sixth transistor M6 has a control electrode coupled to the input signal terminal, a first electrode coupled to the second electrode of the fifth transistor M5, and a second electrode coupled to the level signal terminal.

The second capacitor C2 has a first end coupled to the first electrode of the sixth transistor M6 and a second end coupled to the second electrode of the sixth transistor M6.

In some embodiments, the transistors of each of the sub-circuits described above are all N-type transistors. In fact, the transistors in the above sub-circuits may all be N-type thin film transistors or may all be P-type thin film transistors, and alternatively may be a combination of N-type thin film transistors and P-type thin film transistors. The first electrode and second electrode of each transistor may correspond to one of the source electrode and the drain electrode and the other, respectively, Depending on various applications, different types of thin film transistors can be selected, as long as the electrode polarity of the selected type of thin film transistors is accordingly changed with reference to the electrode polarity of the transistors according to the embodiments of the present disclosure, thereby achieving flexible control, which will not be described in detail herein.

Correspondingly, the embodiments of the present disclosure further provide a method of driving the above shift register, and the method includes a first phase, a second phase, a third phase, and a fourth phase.

In the first phase, the input signal is output to the pull-up node through the input sub-circuit 1 under the control of the first clock signal and the input signal. The first phase is also called an input phase, in which the voltage level of the pull-up node PU is pulled up to a high level and the voltage level of the pull-down node PD is pulled down to a low level, according to the input signal Input and the first clock signal CLKA.

In the second phase, the second clock signal is output to the output terminal through the output sub-circuit 2 under the control of the voltage level of the pull-up node. The second phase is also called an output phase, in which the gate driving signal of the current stage is output according to the second clock signal CLKB in a case where the voltage level of the pull-up node is high.

In the third phase, the voltage level of the pull-down node PD is controlled by the first clock signal, and the voltage levels of the pull-up node PU and the output terminal are reset through the reset sub-circuit 3 under the control of the voltage level of the pull-down node PD. The third phase is also called a reset phase, in which the pull-down node PD is charged according to the input signal Input and the first clock signal CLKA, to reset the pull-up node PU and the output terminal.

In the fourth phase, the voltage level of the pull-down node PD is controlled through the reset control sub-circuit 4 under the control of the first clock signal CLKA and the input signal Input, such that the voltage levels of the pull-up node PU and the output terminal are reset to the voltage level VGL through the reset sub-circuit 3. The fourth phase is also called a holding phase, in which the voltage levels of the pull-up node PU and the output terminal are maintained low in a case where the voltage level of the pull-down node PD is high.

In some embodiments, the first clock signal CLKA and the second clock signal CLKB are complementary pulse signals. That is, when the first clock signal CLKA is at a high level, the second clock signal CLKB is at a low level; and when the first clock signal CLKA is at a low level, the second clock signal CLKB is at a high level. According to the timing of the first clock signal CLKA and the second clock signal CLKB, the existing clock timing can be directly adopted to avoid complicated clock design.

The output signal OUT of the previous stage of shift register is adopted as the input signal Input of the input sub-circuit 1 and the reset sub-circuit 3 of the current stage of shift register. Since both the input phase and the holding phase use the same input signal Input, the current stage of shift register does not need the next shift register to provide the reset signal of the current stage, thereby simplifying the wirings.

Figure 4:
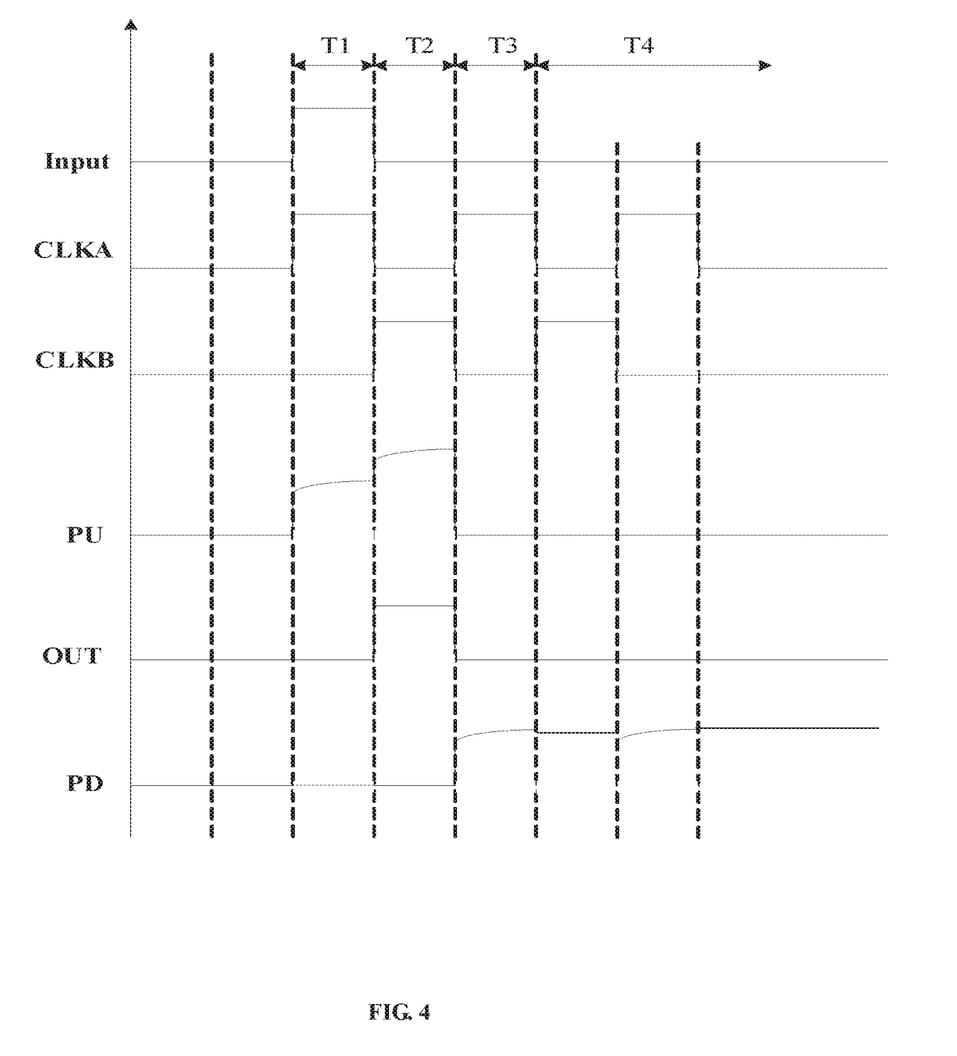
FIG. 4 is a timing diagram of a gate driving circuit according to an embodiment of the present disclosure.

As shown in FIG. 4, taking the case where all the transistors are N-type transistors as an example, the specific driving process of the method of driving the shift register includes an input phase, an output phase, a reset phase, and a holding phase.

In the input phase corresponding to the above-described first stage T1, the input signal Input and the first clock signal CLKA are at a high level, the second clock signal CLKB is at a low level, the input signal Input and the first clock signal CLKA are active, and the first and second transistors M1 and M2 are turned on to charge the pull-up node PU. Meanwhile, the sixth transistor MC is turned on, the second capacitor C2 is discharged through the sixth transistor MC, and the fifth transistor M5 is turned on, By setting the width-to-length ratio of the fifth transistor M5 to be smaller than the width-to-length ratio of the sixth transistor M6, the voltage level of the pull-down node PD is pulled down to the level signal VGL having a low level, so that the fourth transistor M4 and the seventh transistor M7 are turned off to ensure that an input is normally applied to the shift register. The first and second transistors M1 and M2 are turned on, and the first capacitor C1 is charged, that is, the pull-up node PU is charged, so the pull-up node PU is at a high level. At this time, the third transistor M3 is turned on, and since the second clock signal CLKB in this phase is at a low level, a low level is Output through the Output terminal. In an embodiment, a ratio of a width-to-length ratio of the fifth transistor M5 to a width-to-length ratio of the sixth transistor M6 is set to 1:5, so that the voltage level of the pull-down node PD is stably pulled down to a low level without an excessively large occupied area of the sixth transistor M6.

In the output phase corresponding to the above-described second stage 12, the first clock signal CLKA and the input signal Input are at a low level, the second clock signal CLKB is at a high level, and the second clock signal CLKB is active. Due to the holding function of the first capacitor C1, the pull-up node PU remains at a high level, the third transistor M3 is turned on, and a high-level output signal OUT is output through the output terminal, that is, the shift register outputs the gate driving signal of the current stage.

In the reset phase corresponding to the above-described third stage 13, the first clock signal CLKA is at a high level, and the second clock signal CLKB and the input signal Input are at a low level. Since the input signal Input is at a low level, the first transistor M1 and the sixth transistor M6 are turned off. The first clock signal CLKA is active, the fifth transistor M5 is turned on, and the second capacitor C2 charges the pull-down node PD through the fifth transistor M5. At this time, the pull-down node PD is at a high level, the fourth transistor M4 and the seventh transistor M7 are turned on, and the voltage levels of the pull-up node PU and the output terminal are pulled down to a low level (that is, the voltage levels of the pull-up node PU and the output terminal are reset) to implement the self-reset function.

In the holding phase corresponding to the above-described fourth stage T4, the input signal Input is kept at a low level. When the second clock signal CLKB is at a high level, since the pull-up node PU is at a low level, the third transistor M3 is turned off, and the output terminal is floating, thereby substantially maintaining the previous level. In addition, the fifth transistor M5 and the sixth transistor M6 are turned off, the pull-down node PD is floating, thereby substantially maintaining the previous level, and the voltage level of the pull-down node PD can be maintained at the previous level more stably due to the presence of the second capacitor C2. When the first clock signal CLKA is at a high level, the fifth transistor M5 is turned on, the second capacitor C2 is charged though the fifth transistor M5, the pull-down node PD is at a high level, and the fourth transistor M4 and the seventh transistor M7 are turned on. At this time, the voltage levels of the pull-up node PU and the output terminal are maintained low until the input signal Input for the next frame is active.

The shift register is designed as a shift register including a gate driving circuit (GOA) of 7T2C, and the number of transistors and the number of signal lines are greatly reduced, so the circuit structure and the layout are simplified, and the structure is simple. In the corresponding driving method, in the holding phase, the voltage levels of the pull-up node PU and the output signal OUT maintain low, and the current stage of shift register is kept in the holding phase until the next frame comes, thereby maintaining the reset state.

It can be seen that the shift register and its corresponding driving method realize the reset phase and the holding phase by the input signal Input and the corresponding circuit coupling. The shift register and its corresponding driving method do not need the next stage of shift register to provide the reset signal of the current stage of shift register, and can realize self-reset through its own circuit structure, so that the shift register can consistently reset, the coupling degree between adjacent two stages of shift registers is reduced, the power consumption is low, the number of signal lines is decreased, and the circuit structure and the layout are simplified.

The embodiments of the present disclosure further provide a gate driving circuit and its corresponding driving method. The gate driving circuit includes the above-described shift register, and multiple stages of shift registers are cascaded to realize the driving of multiple rows.

Figure 5:
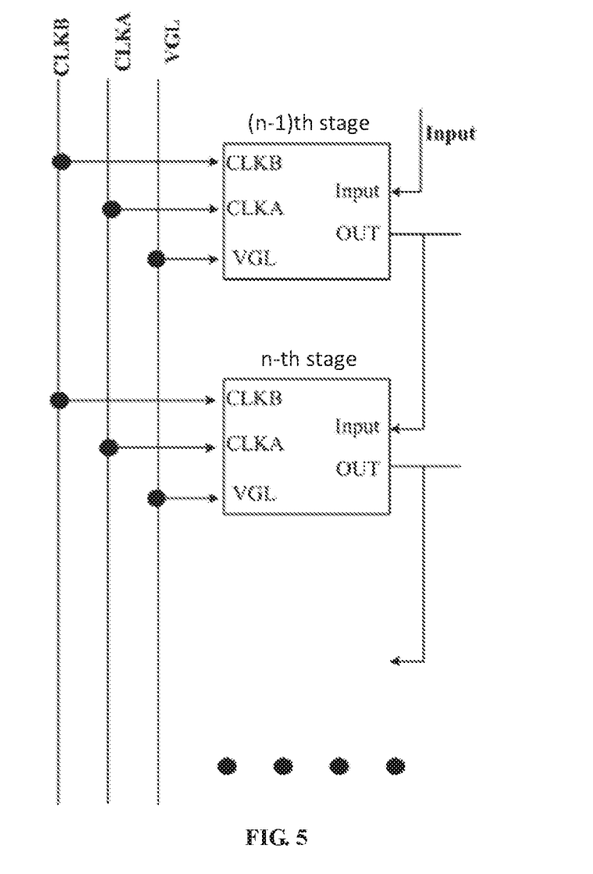
FIG. 5 is a schematic diagram illustrating a gate driving circuit including a plurality of cascaded shift registers, according to an embodiment of the present disclosure.

As shown in FIG. 5, in the gate driving circuit and between the output terminal of the previous stage of shift register and the current stage of shift register, there is only the coupling between the output terminal of the previous stage and the input terminal of the current stage. The output terminal of the previous stage of shift register is coupled to the input sub-circuit and the reset sub-circuit of the current stage of shift register.

On the basis of the above-described method of driving the shift register, in the method of driving the gate driving circuit, the output signal OUT of the previous stage of shift register serves as the input signal Input of the input sub-circuit and the reset sub-circuit of the current stage of shift register.

According to the relationship of the input signals of the shift registers, as compared to an existing GOA circuit, the gate driving circuit according to the embodiments of the present disclosure does not needs any additional signal coupling between stages other than the coupling. Therefore, the power consumption is low, the area is saved, the number of signal lines is small, the circuit structure and the layout are simplified, so that the bezel of the display panel can be narrower, which facilitates narrow bezel design.

It can be understood that, generally, the shift register according to the embodiments of the present disclosure may be applied to a progressive scanning circuit of a display device, or an interlaced scanning circuit of a display device, and configured to provide a corresponding gate driving signal to the progressive scanning circuit or the interlaced scanning circuit. The above display devices include, but are not limited to, LCD, OLED.

It can be understood that the foregoing embodiments are merely exemplary embodiments used for describing the principle of the present disclosure, but the present disclosure is not limited thereto. Those of ordinary skill in the art may make various variations and improvements without depart-

What is claimed is:

1. A shift register, comprising:
an input sub-circuit coupled to an input signal terminal and a first clock signal terminal, and configured to output an input signal provided by the input signal terminal to a pull-up node under control of a first clock signal of the first clock signal terminal;
an output sub-circuit coupled to the input sub-circuit, an output terminal, and a second clock signal terminal, and configured to output a second clock signal of the second clock signal terminal to the output terminal under control of a voltage level of the pull-up node;
a reset control sub-circuit coupled to a pull-down node, the input signal terminal, the first clock signal terminal, and a level signal terminal, and configured to control, according to the input signal and the first clock signal, a voltage level of the pull-down node independently from the second clock signal of the second clock signal terminal; and
a reset sub-circuit coupled to the output terminal, the pull-down node, the pull-up node, and the level signal terminal, and configured to reset the voltage level of the pull-up node and a voltage level of the output terminal under control of the voltage level of the pull-down node,
wherein the reset control sub-circuit comprises a fifth transistor, a sixth transistor, and a second capacitor,
the fifth transistor has a control electrode and a first electrode both coupled to the first clock signal terminal, and a second electrode coupled to the pull-down node,
the sixth transistor has a control electrode coupled to the input signal terminal, a first electrode coupled to the second electrode of the fifth transistor, and a second electrode coupled to the level signal terminal,
the second capacitor has a first end coupled to the first electrode of the sixth transistor and a second end coupled to the second electrode of the sixth transistor, and
a ratio of a width-to-length ratio of the fifth transistor to a width-to-length ratio of the sixth transistor is 1:5.

2. The shift register of claim 1, wherein the input sub-circuit comprises a first transistor and a second transistor,
the first transistor has a control electrode and a first electrode both coupled to the input signal terminal, and a second electrode coupled to a first electrode of the second transistor, and
the second transistor has a control electrode coupled to the first clock signal terminal and a second electrode coupled to the pull-up node.

3. A gate driving circuit, comprising a plurality of shift registers of claim 2, the plurality of shift registers being cascaded.

4. The shift register of claim 1, wherein the output sub-circuit comprises a third transistor and a first capacitor,
the third transistor has a control electrode coupled to the pull-up node, a first electrode coupled to the second clock signal terminal, and a second electrode coupled to the output terminal, and
the first capacitor has a first end coupled to the control electrode of the third transistor and a second end coupled to the second electrode of the third transistor.

5. A gate driving circuit, comprising a plurality of shift registers of claim 4, the plurality of shift registers being cascaded.

6. The shift register of claim 1, wherein the reset sub-circuit comprises:
an output reset sub-circuit coupled to the output terminal, the pull-down node, and the level signal terminal, and configured to reset the voltage level of the output terminal to a level signal provided by the level signal terminal, under control of the voltage level of the pull-down node; and
a pull-up node reset sub-circuit coupled to the pull-up node, the pull-down node, and the level signal terminal, and configured to reset the voltage level of the pull-up node to the level signal provided by the level signal terminal, under control of the voltage level of the pull-down node.

7. The shift register of claim 6, wherein
the output reset sub-circuit comprises a fourth transistor having a control electrode coupled to the pull-down node, a first electrode coupled to the output terminal, and a second electrode coupled to the level signal terminal; and
the pull-up node reset sub-circuit comprises a seventh transistor having a control electrode coupled to the pull-down node, a first electrode coupled to the pull-up node, and a second electrode coupled to the level signal terminal.

8. A gate driving circuit, comprising a plurality of shift registers of claim 7, the plurality of shift registers being cascaded.

9. A gate driving circuit, comprising a plurality of shift registers of claim 6, the plurality of shift registers being cascaded.

10. A gate driving circuit, comprising a plurality of shift registers of claim 1, the plurality of shift registers being cascaded.

11. The gate driving circuit of claim 10, wherein an output terminal of a previous stage of shift register among the plurality of shift registers is coupled to an input signal terminal of a current stage of shift register among the plurality of shift registers.

* * * * *